(12) United States Patent
Lin

(10) Patent No.: US 8,847,655 B2
(45) Date of Patent: Sep. 30, 2014

(54) BINARY CONTROL ARRANGEMENT AND METHOD OF MAKING AND USING THE SAME

(75) Inventor: Mu-Shan Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/477,977

(22) Filed: May 22, 2012

(65) Prior Publication Data

US 2013/0314146 A1  Nov. 28, 2013

(51) Int. Cl.
 *H03L 5/00* (2006.01)
(52) U.S. Cl.
 USPC .......................... 327/308; 327/404; 327/520
(58) Field of Classification Search
 USPC ......... 327/308, 404, 405, 427, 434, 436, 478, 327/482, 519, 520, 566, 574, 581
 See application file for complete search history.

(56) References Cited

U.S. PATENT DOCUMENTS

| | | | | | |
|---|---|---|---|---|---|
| 2,369,088 | A | * | 2/1945 | Thompson | 369/133 |
| 6,326,821 | B1 | * | 12/2001 | Gabara | 327/112 |
| 7,126,861 | B2 | * | 10/2006 | Hose et al. | 365/189.09 |
| 7,382,203 | B2 | * | 6/2008 | Kang | 331/57 |
| 7,843,979 | B2 | * | 11/2010 | Rees et al. | 372/38.02 |
| 8,059,724 | B2 | * | 11/2011 | Salomon | 375/257 |
| 8,427,852 | B2 | * | 4/2013 | Feldtkeller | 363/64 |
| 2004/0202215 | A1 | * | 10/2004 | Fairgrieve | 372/38.02 |
| 2011/0304376 | A1 | * | 12/2011 | Utsunomiya | 327/308 |
| 2013/0257491 | A1 | * | 10/2013 | Won et al. | 327/109 |

* cited by examiner

*Primary Examiner* — William Hernandez
(74) *Attorney, Agent, or Firm* — Lowe Hauptman & Ham, LLP

(57) ABSTRACT

The present description relates to a semiconductor device including an array of two or more switching elements and a controller electrically connected to the array of switching elements. At least one switching element of the array of switching elements has a different electrical resistance than at least another switching element of the array of switching elements. The controller is configured to generate and transmit at least one coarse tuning signal and at least one fine tuning signal. The array of switching elements is configured to alter an electrical resistance of the array of switching elements in response to the at least one coarse tuning signal and the at least one fine tuning signal. The present description also includes a method of making a semiconductor device and a method of using a semiconductor device.

20 Claims, 7 Drawing Sheets

BINARY CONTROL ARRANGEMENT AND METHOD OF MAKING AND USING THE SAME

BACKGROUND

Circuitry using switching elements as resistors is used to provide a variable resistance between two elements. By activating or deactivating switching elements, such as metal-oxide-semiconductor (MOS) transistors, the resistance provided by the MOS transistors is altered. As the size of the MOS transistor increases, the resistance across the active transistor decreases. However, the resistance reduction in relation to the size increase of the MOS transistor diminishes as the MOS transistor size increases.

In a straight binary control arrangement, a plurality of MOS transistors is electrically connected in a parallel arrangement with each MOS transistor having a different size. The straight binary control arrangement is easier to design than other control arrangements and facilitates switching between different resistance values. However, a separation between the different resistance values is not uniform, which in some instances, limits the application of the straight binary control arrangement. The straight binary control arrangement also experiences resistance saturation for large MOS transistor sizes, limiting a resistance tuning range.

In a thermal control arrangement, MOS transistors are electrically connected in parallel, with each MOS transistor having substantially the same size. The thermal control provides greater uniformity between the different resistances than the straight binary control arrangement. In a thermal control arrangement, each of the plurality of MOS transistors has a line electrically connected to a gate of the MOS transistor. As the number of MOS transistors increases, the number of lines in the control bus also increases. For thermal control arrangements having a wide resistance tuning range, the complexity and size of a layout of the thermal control arrangement is greater than the straight binary control arrangement.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
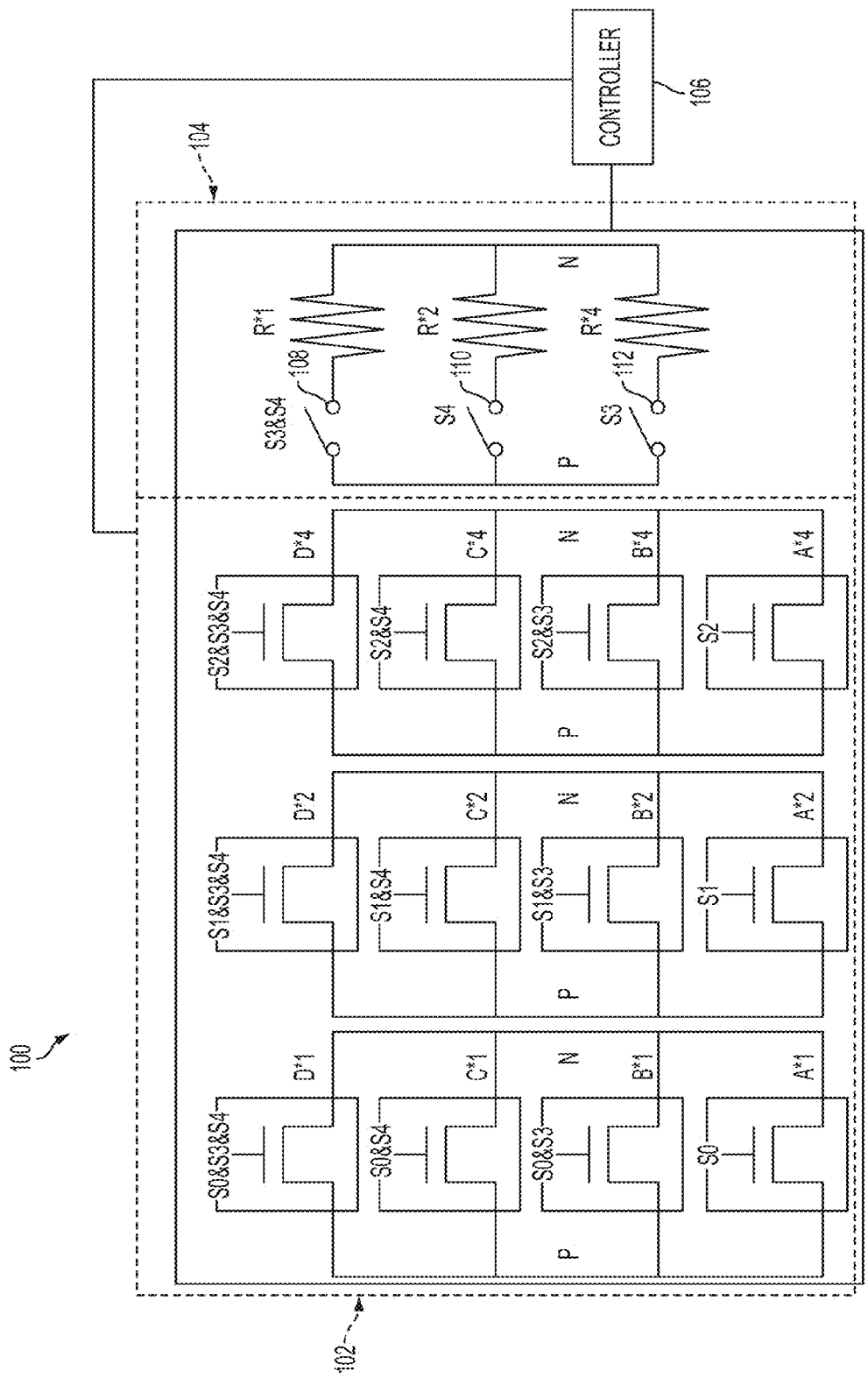
FIG. 1 is a schematic diagram of a binary control arrangement according to one or more embodiments.

FIG. 1 is a schematic diagram of a binary control arrangement 100 in accordance with at least one embodiment. Binary control arrangement 100 includes an array of switching elements 102 and an array of resistors 104. Each switching element of array of switching elements 102 and each resistor of array of resistors 104 are electrically connected to a controller 106. An electrical resistance of binary control arrangement 100 is altered based on tuning signals generated by controller 106 which activate switching elements in array of switching elements 102.

Array of switching elements 102 comprises twelve switching elements A1, A2, A4, B1, B2, B4, C1, C2, C4, D1, D2 and D4. In some embodiments, binary control arrangement 100 includes an array of more than twelve switching elements. In some embodiments, binary control arrangement 100 includes an array of less than twelve switching elements.

The array of switching elements 102 is formed as a linear array. In some embodiments, the array of switching elements 102 is formed as a two-dimensional array. In some embodiments where the array of switching elements 102 is formed as a two-dimensional array, the array of switching elements 102 includes switching elements formed in different metal layers of a semiconductor device.

The array of switching elements 102 comprises metal-oxide-semiconductor (MOS) transistors. In some embodiments, the array of switching elements comprises bipolar junction transistor (BJTs) or other suitable transistors. In some embodiments, the array of switching elements comprises mechanical switches. In some embodiments, the array of switching elements comprises thyristors.

Switching element A2 has an device size, for example a gate width of a transistor, twice the value of an device size of switching element A1. Similarly, switching element A4 has an device size twice the value of the device size of switching element A2.

Switching elements in row B have device size twice the value of the corresponding switching elements in row A. Similarly, switching elements in row C have device size twice the value of the corresponding elements in row B and switching elements in row D have device size twice the value of the corresponding switching elements in row C.

A gate of each MOS transistor of switching elements 102 is electrically connected to controller 106. Controller 106 is configured to provide at least one coarse tuning signal and at least one fine tuning signal. Controller 106 is configured to provide three fine tuning signals S0, S1 and S2 as well as two coarse tuning signals S3 and S4. The fine tuning signals and coarse tuning signals selectively activate or deactivate each MOS transistor in array of switching elements 102.

In operation, MOS transistor A1 is selectively activated or deactivated by fine tuning signal S0 received at a gate of MOS transistor A1. MOS transistor A2 is selectively activated or deactivated by fine tuning signal S1 received at a gate of MOS transistor A2. MOS transistor A4 is selectively activated or deactivated by fine tuning signal S2 received at a gate of MOS transistor A4.

Other MOS transistors are selectively activated based on a combination of fine tuning signals and coarse tuning signals received at the gate of each MOS transistor. MOS transistors in row B receive a combination of coarse tuning signal S3 and fine tuning signals S0-S2. MOS transistors in row C receive a combination of coarse tuning signal S4 and fine tuning signals S0-S2. MOS transistors in row D receive a combination of coarse tuning signals S3 and S4 and fine tuning signals S0-S2.

In some embodiments, binary control arrangement 100 includes a logic circuit between controller 106 and array of switching elements 102. The logic circuit is configured to receive the at least one fine tuning signal and the at least one coarse tuning signal from controller 106 and output an activation signal based on the combination of fine tuning signals and coarse tuning signals.

In some embodiments, array of switching elements 102 is directly connected to controller 106 and includes internal circuitry to selectively activate or deactivate each switching element based on a combination of fine tuning signals and coarse tuning signals.

Array of resistors 104 comprises three resistors R1, R2 and R4. In some embodiments, binary control arrangement 100 includes an array of more than three resistors. In some embodiments, binary control arrangement 100 includes an array of less than three resistors. A number of resistors in array of resistors 104 is selected to maintain a linear relationship between coarse tuning signals S3 and S4 and overall resistance of binary control arrangement 100.

In operation, a flow of electrical current through resistor R1 is controlled by switch 108. A flow of electrical current through resistor R2 is controlled by switch 110. A flow of electrical current through resistor R4 is controlled by switch 112. In some embodiments, switches 108, 110 and 112 are independently selected from a mechanical switch, a transistor, a thyristor or other suitable switching device.

Switch 108 is controlled by a combination of coarse tuning signals S3 and S4. Switch 110 is controlled by coarse tuning signal S4. Switch 112 is controlled by coarse tuning signal S3.

Array of resistors 104 helps to maintain a linear relationship between the electrical resistance of binary control arrangement 100 and the fine tuning and the coarse tuning signals. Array of resistors 104 are configured to be controlled by coarse tuning signals S3 and S4 to maintain consistent spacing between groups of fine tuning intervals, as depicted in FIG. 2.

Figure 2:
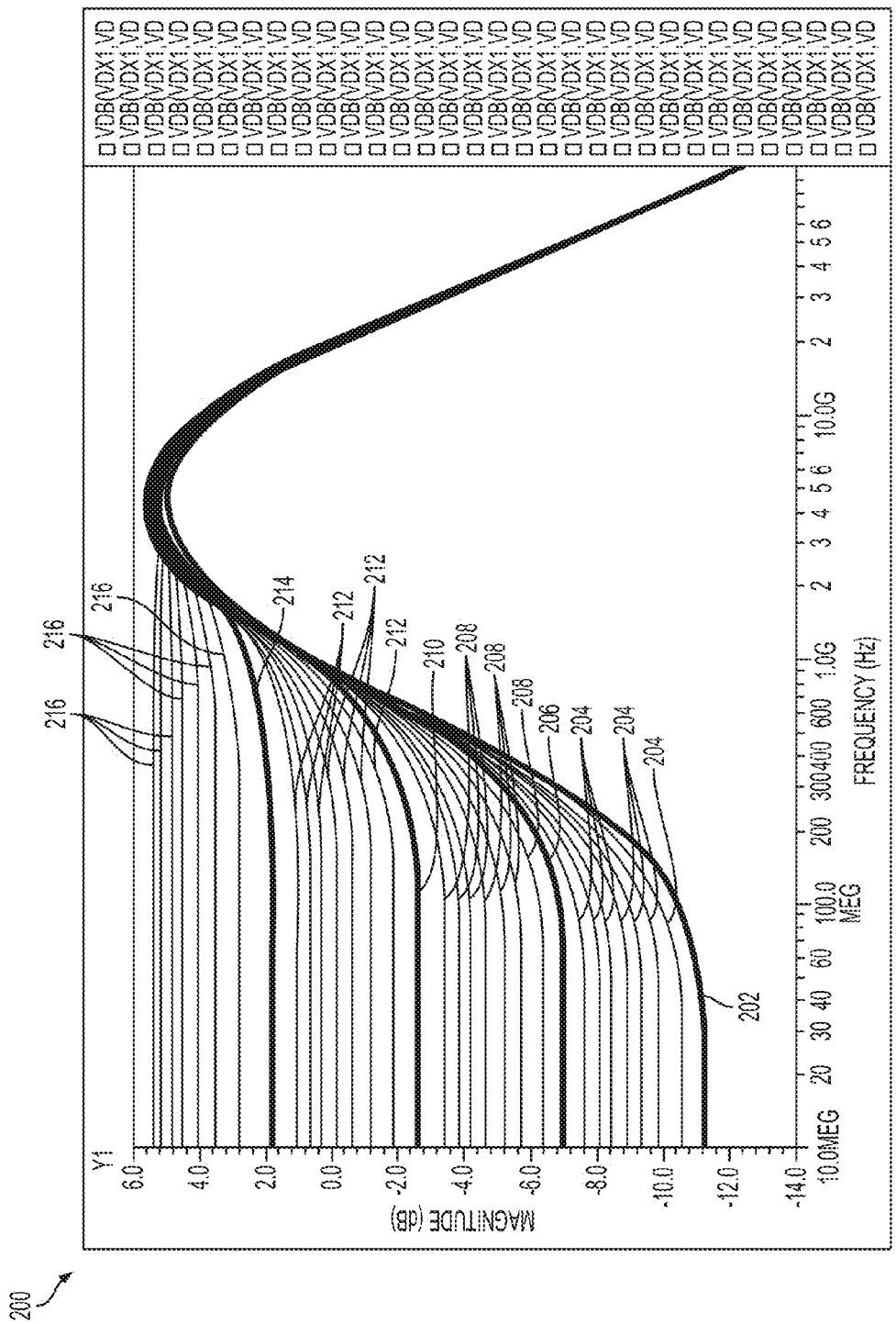
FIG. 2 is a graph of impedance versus frequency for the binary control arrangement of FIG. 1 according to one or more embodiments.

FIG. 2 is a graph 200 of impedance versus frequency for binary control arrangement 100. Line 202 corresponds to an impedance profile of a greatest signal reduction of binary control arrangement 100. To produce the impedance profile of line 202, coarse tuning signals S3 and S4 do not activate any switching elements of array of switching elements 102. Lines 204 correspond to impedance profiles of binary control arrangement 100 for fine tuning intervals in which coarse tuning signals S3 and S4 do not activate any switching elements. The different fine tuning intervals are achieved by activating different combinations of switching elements A1, A2 and A4.

Binary control arrangement 100 generates the frequency response depicted in FIG. 2 by altering an overall resistance. The overall resistance is based on coarse tuning signals S3 and S4 and fine tuning signals S0-S2, as discussed above with respect to FIG. 1. The overall resistance in turn produces a source-degeneration for a differential amplifier. As the resistance of binary control arrangement 100 increases, a low frequency gain of the differential amplifier will degrade. However, a high frequency gain of the differential amplifier will be dominated by a separate capacitor. In this manner, binary control arrangement 100 generates the frequency response based on changes in resistance Line 206 corresponds to an impedance profile of binary control arrangement 100 in which coarse tuning signal S3 activates switching elements in array of switching elements 102, but coarse tuning signal S4 does not activate switching elements. Lines 208 correspond to impedance profiles of binary control arrangement 100 for fine tuning intervals in which coarse tuning signal S3 activates switching elements in array of switching elements 104, but coarse tuning signal S4 does not activate switching elements. The different fine tuning intervals are achieved by activating different combinations of switching elements B1, B2 and B4.

Line 210 corresponds to an impedance profile of binary control arrangement 100 in which coarse tuning signal S4 activates switching elements in array of switching elements 102, but coarse tuning signal S3 does not activate switching elements. Lines 212 correspond to impedance profiles of binary control arrangement 100 for fine tuning intervals in which coarse tuning signal S4 activates switching elements in array of switching elements 102, but coarse tuning signal S3 does not activate switching elements. The different fine tuning intervals are achieved by activating different combinations of switching elements C1, C2 and C4.

Line 214 corresponds to an impedance profile of binary control arrangement 100 both coarse tuning signals S3 and S4 activate switching elements in array of switching elements 102. Lines 216 correspond to impedance profiles of binary control arrangement 100 for fine tuning intervals in which both coarse tuning signals S3 and S4 activate switching elements in array of switching elements 102. The different fine tuning intervals are achieved by activating different combinations of switching elements D1, D2 and D4.

As depicted in graph 200, an interval between different impedance profiles is substantially uniform. The interval between different impedance profiles is determined by the number of switching elements in array of switching elements 102. As the number of switching elements increases, the interval between impedance profiles decreases; however, the size of the semiconductor device increases. Array of resistors 104 helps to maintain a substantially uniform interval.

Figure 3:
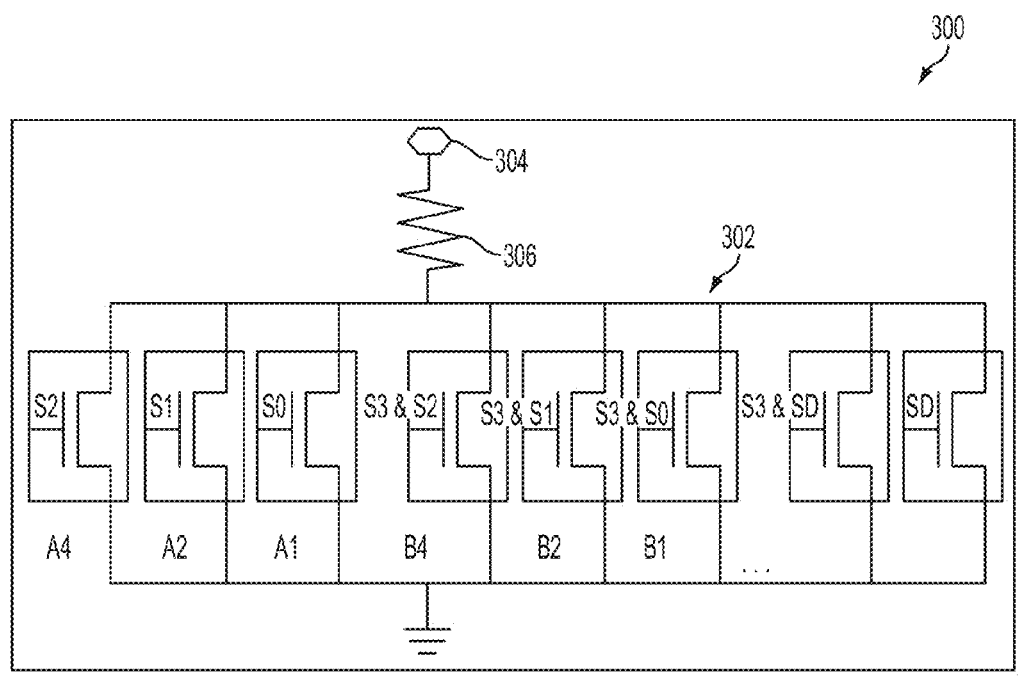
FIG. 3 is a schematic diagram of a binary control arrangement having an array of transistors connected in parallel according to one or more embodiments.

FIG. 3 is a schematic diagram of a binary control arrangement 300 having an array of transistors 302 connected in parallel. Array of transistors 302 are connected to a power source 304 via a resistor 306. Transistors A1, A2, A4, B1, B2 and B4 correspond to transistors A1, A2, A4, B1, B2 and B4 of FIG. 1. The remaining transistors from FIG. 1 are not shown for simplicity.

Figure 4:
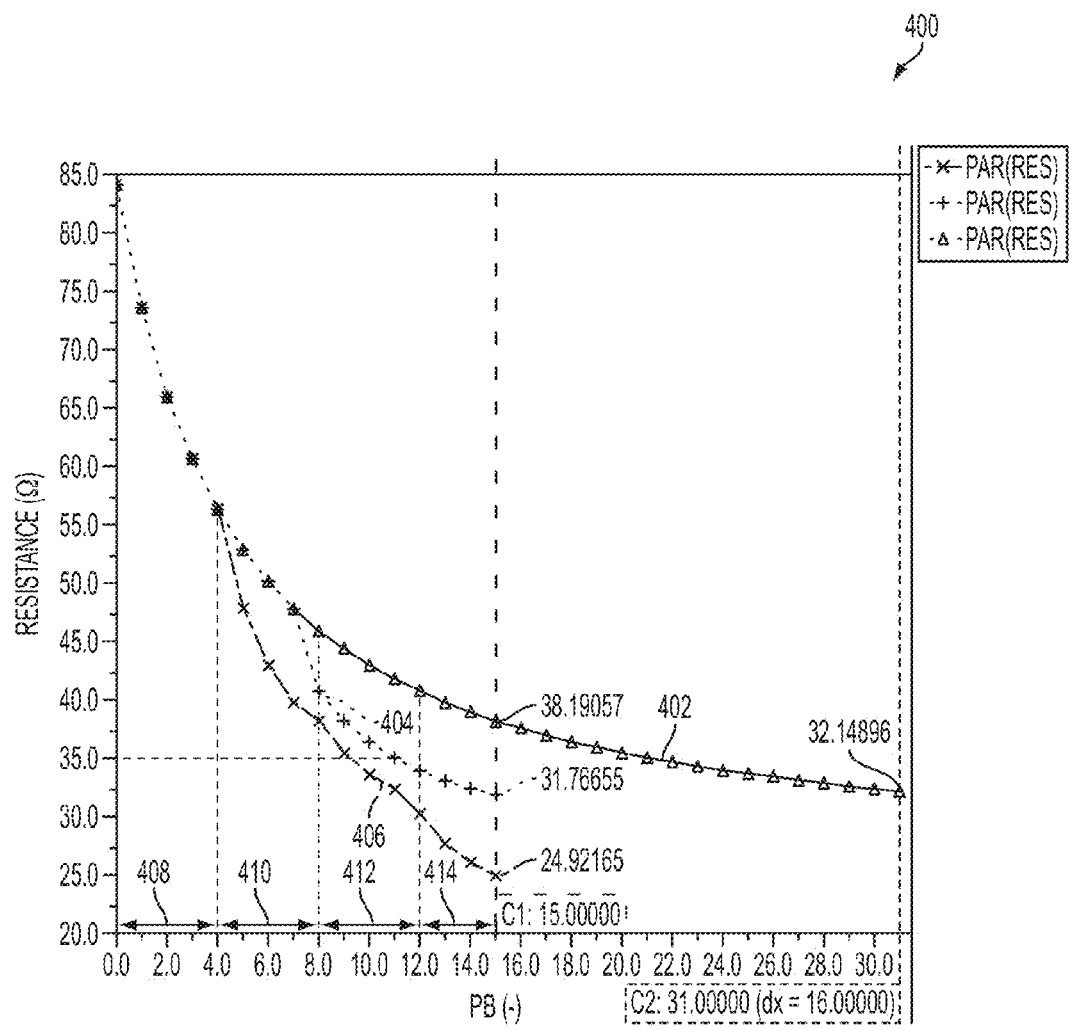
FIG. 4 is a graph of resistance versus binary control code for several binary control arrangements according to one or more embodiments.

FIG. 4 is a graph 400 of resistance versus binary control code for several binary control arrangements according to various embodiments. Line 402 corresponds to a resistance of a binary control arrangement configured to receive five fine tuning signals and no coarse tuning signals. Line 404 corresponds to a resistance of a binary control arrangement, according to some embodiments, configured to receive three fine tuning signals and one coarse tuning signal. Line 406 corresponds to a resistance of a binary control arrangement, according to some embodiments, configured to receive two fine tuning signals and two coarse tuning signals.

As depicted by line 402, the resistance becomes saturated at approximately 32 ohms. Resistance saturation describes a situation in which regardless of an increase in size of a switching element, the resistance of the switching element does not diminish. In the embodiment of FIG. 4, a resistance range obtained by the binary control arrangement having five fine tuning signals is from 84 ohms to 32.1 ohms.

As depicted by line 404, the binary control arrangement having three fine tuning signals and one coarse tuning signal is capable of a wider resistance range than the binary control arrangement having five fine tuning signals. The addition of the coarse tuning signal allows the resistance range to increase to a range from 84 ohms to 31.8 ohms. Further, the use of the coarse tuning signal decreases the number of switching elements necessary to obtain the lowest resistance value. Thus, the binary control arrangement corresponding to line 404 is capable of achieving a wider resistance range with a semiconductor device having a smaller size than the binary control arrangement corresponding to line 402.

As depicted by line 406, the binary control arrangement having two fine tuning signals and two coarse tuning signals is capable of a wider resistance range than either of the other two binary control arrangements. The resistance range of the binary control arrangement corresponding to line 406 is from 84 ohms to 24.9 ohms. The number of switching elements for the binary control arrangement corresponding to line 406 is the same as the number of switching elements for the binary control arrangement corresponding to line 404.

As depicted in graph 400, line 406 includes four coarse tuning regions. A first coarse tuning region 408 occurs if both coarse tuning signals do not activate associated switching elements. The resistance profile for first coarse tuning region 408 is substantially the same for each of lines 402, 404 and 406.

A second coarse tuning region 410 occurs if a first coarse tuning signal activates associated switching elements but a second coarse tuning signal does not. As depicted by line 406, the resistance decreases sharply in comparison to lines 402 or 404. The decreased resistance allows for compensation for higher channel loss than is possible with either of the other two binary control arrangements.

A third coarse tuning region 412 occurs if the second coarse tuning signal activates associated switching elements but the first coarse tuning signal does not. As depicted by line 406, the resistance remains less than either lines 402 and 404. In third coarse tuning region 412, line 404 also depicts a large decrease in resistance in comparison with line 402. This portion of line 404 corresponds to the single course tuning signal corresponding to line 404 activating associated switching elements.

A fourth coarse tuning region 414 occurs if both the first and second coarse tuning signal activate associated switching elements. As depicted by line 406, the resistance again decreases sharply in comparison to lines 402 and 404.

Within each of the coarse tuning regions, 'X' data points indicate a resistance for line 406 obtained using different combinations of fine tuning signals. The fine tuning signals facilitate tuning of the resistance within each of the coarse tuning regions enabling a flexible response to channel loss.

As the number of fine tuning signals increases, the interval between obtainable resistances decreases, but a size of the binary control arrangement increases. Similarly, as a number of coarse tuning signals increases, the resistance range increases, but the size of the binary control arrangement increases. During a design phase of a semiconductor device, greater flexibility and increased resistance range is balanced by minimizing the size of the binary control arrangement.

Figure 5:
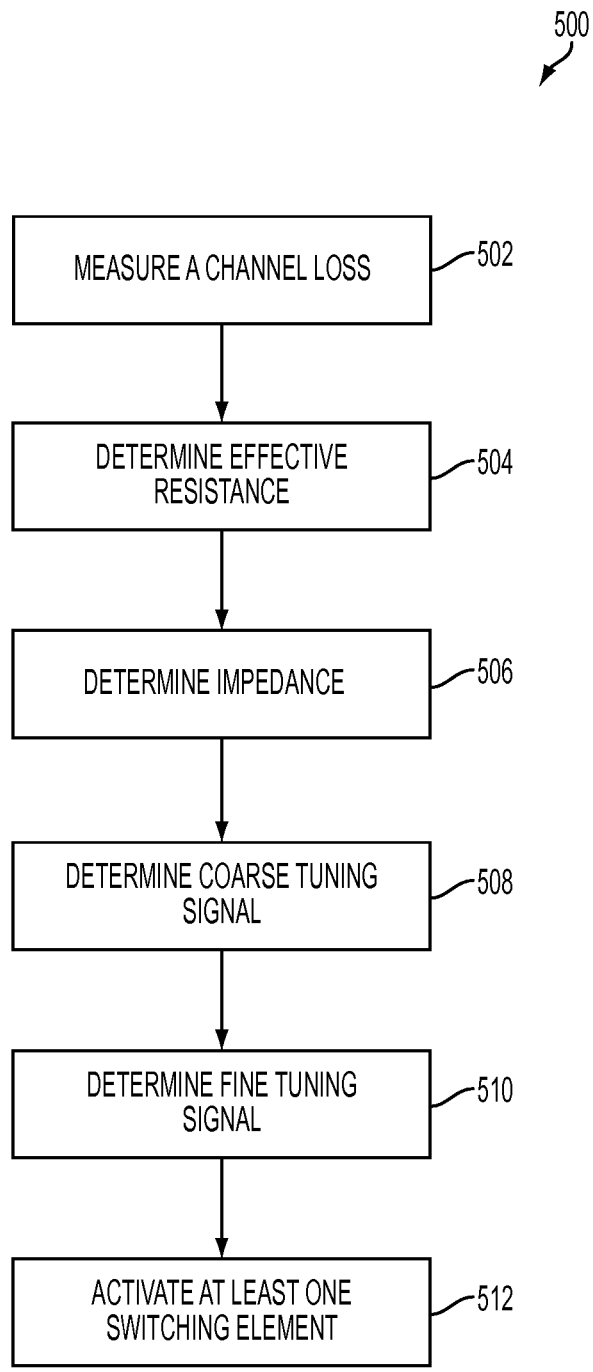
FIG. 5 is a flow chart of a method of using a binary control arrangement according to one or more embodiments.

FIG. 5 is a flow chart of a method 500 of using a binary control arrangement. In operation 502, a channel loss of an input signal is measured using suitable measurement equipment. The channel loss is inversely proportional to coherency of the input signal, i.e., as the channel loss increases the coherency of the input signal decreases. In some embodiments, channel loss is measured using a spectrogram or other suitable device. In some embodiments, the channel loss is measured by sampling a serial data output from a channel and using a sampling edge to determine whether an increased or decreased gain is needed to maintain signal integrity.

Figure 6A:
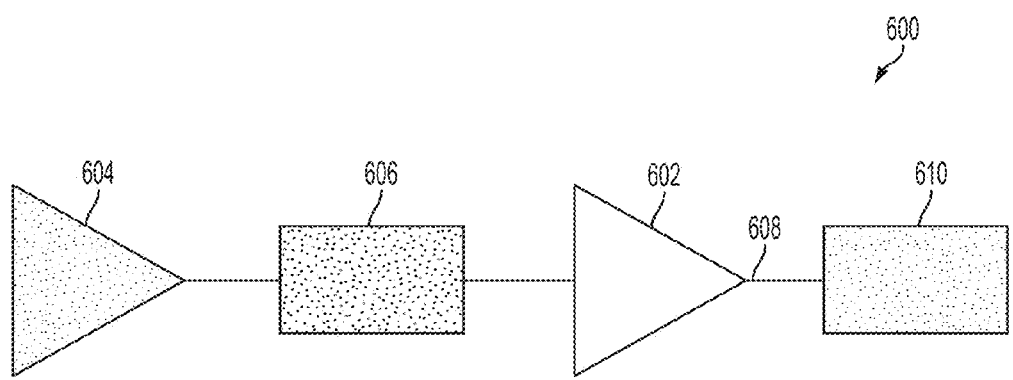
FIG. 6A is a schematic diagram of a transmission system including a binary control arrangement according to one or more embodiments.
Figure 6B:
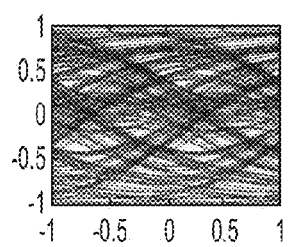
FIG. 6B is a diagram of signal coherency prior to incidence with a binary control arrangement according to one or more embodiments.
Figure 6C:
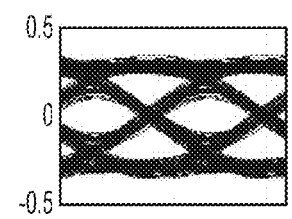
FIG. 6C is a diagram of signal coherency after passing through a binary control arrangement according to one or more embodiments.

FIG. 6A is a diagram of a transmission system 600 including a binary control arrangement, such as binary control arrangement 100, in an equalizer 602. A signal source 604 outputs a signal along a channel 606. In some embodiments, channel 606 is a cable or a wire. In some embodiments, channel 606 is a wireless communication channel. As the signal travels along channel 606, the coherency of the signal decreases, as depicted in FIG. 6B. Equalizer 602 includes the binary control arrangement, which measures the channel loss and increases the coherency of the signal based on the measured channel loss. After the signal propagates through equalizer 602, the coherency of the signal is increased, as depicted in FIG. 6C. The signal then travels along a channel 608 to a receiver 610. In some embodiments, receiver 610 includes an additional equalizer. In some embodiments, equalizers are disposed at multiple locations between signal source 604 and receiver 610.

Returning to FIG. 5, in optional operation 504, an effective resistance of the binary control arrangement is determined. After the channel loss is measured, the effective resistance sufficient to increase coherency of the input signal into an accurately readable form is calculated. In some embodiments, the calculation to determine the effective resistance is performed by a controller, e.g., controller 106. In some embodiments, the calculation to determine the effective resistance is performed by circuitry external to the binary control arrangement, e.g., a computer containing a non-transitory memory storage medium and a processor, and transmitted to the binary control arrangement.

In optional operation 506, an impedance is determined. The impedance is an amount of delay added by the binary control arrangement to increase the coherency of the input signal. In some embodiments, the calculation to determine the impedance is performed by a controller, e.g., controller 106. In some embodiments, the calculation to determine the impedance is performed by circuitry external to the binary control arrangement, e.g., a computer containing a non-transitory memory storage medium and a processor, and transmitted to the binary control arrangement.

In operation 508, a coarse tuning signal is determined. In some embodiments, the coarse tuning signal is determined based on the effective resistance determined in optional operation 504. For example, referring to FIG. 4, if the effective resistance is determined to be 35 ohms (third coarse tuning region 412), the coarse tuning signal for the binary control arrangement corresponding to line 406 activates switching elements associated with the second coarse tuning signal but not the first coarse tuning signal. For the binary control arrangement corresponding to line 404, the single coarse tuning signal activates the associated switching elements.

In some embodiments, a value of the coarse tuning signal is determined based on the impedance determined in optional operation 506. For example, referring to FIG. 2, if the impedance is determined to be −4.6 dB (between lines 206 and 210), the coarse tuning signal for binary control arrangement 100 activates the switching elements associated with S3, but not the switching element associated with S4. Thus, coarse tuning signal S3 has an "on" value and coarse tuning signal S4 has an "off" value. In some embodiments, the "on" and "off" values correspond to high and low logical value signals are based on a type of signal used to active the switching element. For example, p-type MOS (PMOS) transistors are activated using a low logical value signal and n-type MOS (NMOS) transistors are activated using a high logical value signal.

In operation 510, a fine tuning signal is determined. In some embodiments, the fine tuning signal is determined based on the effective resistance determined in optional operation 504. For example, referring to FIG. 4, if the effective resistance is determined to be 35 ohms (third coarse tuning region 412), the fine tuning signal for the binary control arrangement corresponding to line 406 activates switching elements associated with a first fine tuning signal but not a second fine tuning signal. For the binary control arrangement corresponding to line 404, a third fine tuning signal activates the associated switching elements but a first and second fine tuning signal does not activate associated switching elements.

In some embodiments, the fine tuning signal is determined based on the impedance determined in optional operation 506. For example, referring to FIG. 2, if the impedance is determined to be −4.6 dB (between lines 206 and 210), the fine tuning signal for binary control arrangement 100 activates the switching elements associated with S2, but not the switching element associated with S0 or S1.

In operation 512, at least one switching element is activated using the coarse tuning signal determined in operation 508 and the fine tuning signal determined in operation 510. For example, if the impedance is determined to be −4.6 dB, the coarse tuning signal is S3 alone and the fine tuning signal is S2 alone. Thus, switching element B4 is activated. In binary control arrangement 100, resistor R4 is also activated.

Figure 7:
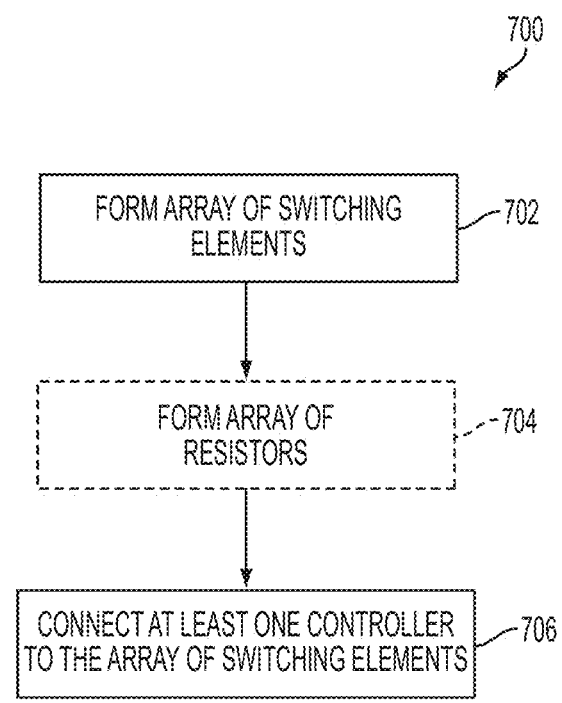
FIG. 7 is a flow chart of a method of making a binary control arrangement according to one or more embodiments.

FIG. 7 is a flow chart of a method 700 of making a binary control arrangement in accordance with at least one embodiment. In operation 702, an array of switching elements is formed. A number of switching elements in the array is selected by considering a degree of precision of the binary control arrangement, a resistance or impedance range, complexity of the design and the size of the binary control arrangement. As the degree of precision and resistance or impedance range increase, the size of the binary control arrangement also increases. As the number of switching elements increases, the complexity of the design and cost of manufacturing the binary control arrangement increase.

A resistance of individual switching elements is selected by considering degree of precision and size of the individual switching elements. Resistance decreases as the size of the individual switching elements increases. A lower resistance value allows more precise tuning of the binary control arrangement; however, the size of the binary control arrangement also increases. As the size of the individual switching elements decreases, the complexity and cost of manufacturing increases.

In optional operation 704, an array of resistors is formed. The array of resistors is electrically connected to the array of switching elements. A number of resistors in the array is selected based on the number of switching elements in the binary control arrangement. Each resistor in the array of resistors is configured to be activated by a switch.

In operation 706, at least one controller is connected to the array of switching elements. The at least one controller is configured to generate and transmit at least one coarse tuning signal and at least one fine tuning signal to the array of switching elements. If optional operation 704 is used, the at least one controller is connected to the array of resistors to generate and transmit the at least one coarse tuning signal to the array of resistors.

In some embodiments, the binary control arrangement is formed as part of an equalizer configured to increase coherency of an input signal.

One aspect of the present description relates to a semiconductor device including an array of two or more switching elements and a controller electrically connected to the array of switching elements. At least one switching element of the array of switching elements has a different electrical resistance than at least another switching element of the array of switching elements. The controller is configured to generate and transmit at least one coarse tuning signal and at least one fine tuning signal. The array of switching elements is configured to alter an electrical resistance of the array of switching elements in response to the at least one coarse tuning signal and the at least one fine tuning signal.

Another aspect of the present description relates to a method of using a semiconductor device including an array of two or more switching elements and a controller configured to generate and transmit at least one coarse tuning signal and at least one fine tuning signal. The method includes measuring a channel loss. The method further includes determining a value of the at least one coarse tuning signal and determining a value of the at least one fine tuning signal. The method also includes activating at least one switching element of the array of switching elements using the at least one coarse tuning signal or the at least one fine tuning signal.

Another aspect of the present description relates to a method of making a semiconductor device including forming an array of two or more switching elements. At least one of the switching elements of the array of switching elements having a different electrical resistance than another of the switching elements of the array of switching elements. The method further includes connecting at least one controller to the array of switching elements. The controller configured to generate and transmit at least one coarse tuning signal and at least one fine tuning signal and the array of switching elements configured to receive the at least one coarse tuning signal and the at least one fine tuning signal.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A semiconductor device comprising:
an array of switching elements, comprising a first set of switching elements and a second set of switching elements, a switching element of the first set of switching elements having a different electrical resistance than a switching element of the second set of switching elements; and
at least one controller electrically connected to the array of switching elements, the controller configured to generate at least one coarse tuning signal, a first fine tuning signal, and a second fine tuning signal,
wherein
the array of switching elements is configured to alter an electrical resistance of the array of switching ele- ments in response to the at least one coarse tuning signal, the first fine tuning signal, and the second fine tuning signal;

the first set of switching elements is configured to be controlled based on a logical value of the first fine tuning signal;

the second set of switching elements is configured to be controlled based on a logical value of the second fine tuning signal; and a corresponding one of the first set of switching elements and a corresponding one of the second set of switching elements are configured to be controlled based on a logical value of the at least one coarse tuning signal.

2. The semiconductor device of claim 1, wherein the array of switching elements comprises an array of metal-oxide-semiconductor (MOS) transistors.

3. The semiconductor device of claim 2, wherein the controller is electrically connected to a gate of each MOS transistor of the array of MOS transistors.

4. The semiconductor device of claim 1, wherein at least one switching element of the array of switching elements is configured to be activated based on the at least one of coarse tuning signal, the first fine tuning signal, or the second fine tuning signal.

5. The semiconductor device of claim 1, wherein the semiconductor device comprises an equalizer comprising the array of switching elements and the at least one controller.

6. The semiconductor device of claim 1, wherein the array of switching elements comprises at least one of a mechanical switch, a transistor, or a thyristor.

7. The semiconductor device of claim 1, further comprising an array of resistors configured to be activated based on the at least one coarse tuning signal.

8. A method of using a semiconductor device comprising an array of switching elements and a controller configured to generate at least one coarse tuning signal, a first fine tuning signal, and a second fine tuning signal, the method comprising:

measuring a channel loss;

determining a value of the at least one coarse tuning signal, a corresponding one of a first set of switching elements of the array of switching elements and a corresponding one of a second set of switching elements of the array of switching elements being configured to be controlled based on the value of the at least one coarse tuning signal;

determining a value of the first fine tuning signal, the first set of switching elements being configured to be controlled based on the value of the first fine tuning signal;

determining a value of the second fine tuning signal, the second set of switching elements being configured to be controlled based on the value of the second fine tuning signal; and activating at least one switching element of the array of switching elements using based on the at least one coarse tuning signal, the first fine tuning signal, or the second fine tuning signal.

9. The method of claim 8, wherein the activating at least one switching element comprises activating at least one metal-oxide-semiconductor (MOS) transistor.

10. The method of claim 9, wherein the activating the at least one MOS transistor comprises receiving the at least one coarse tuning signal, the first fine tuning signal, or the second fine tuning signal at a gate of the at least one MOS transistor.

11. The method of claim 8, wherein the determining the value of the at least one coarse tuning signal comprises dividing a resistance tuning range by a number of coarse tuning lines.

12. The method of claim 8, wherein the determining the value of the first fine tuning signal or the determining the value of the second fine tuning signal comprises-dividing a coarse tuning range by a number of fine tuning lines.

13. The method of claim 8, further comprising activating at least one resistor of an array of resistors using the at least one coarse tuning signal.

14. A method of making a semiconductor device, the method comprising:

forming an array of switching elements, comprising a first set of switching elements and a second set of switching elements, a switching element of the first set of switching elements having a different electrical resistance than a switching element of the second set of switching elements; and connecting at least one controller to the array of switching elements, the controller configured to generate at least one coarse tuning signal, a first fine tuning signal, and a second fine tuning signal, wherein the connecting at least one controller to the array of switching elements is performed in a manner that the first set of switching elements is configured to be controlled based on a logical value of the first fine tuning signal;

the second set of switching elements is configured to be controlled based on a logical value of the second fine tuning signal; and a corresponding one of the first set of switching elements and a corresponding one of the second set of switching elements are configured to be controlled based on a logical value of the at least one coarse tuning signal.

15. The method of claim 14, wherein the forming an array of switching elements comprises forming an array of metal-oxide-semiconductor (MOS) transistors.

16. The method of claim 15, wherein the connecting the controller comprises configuring a gate of each MOS transistor in the array of MOS transistors to receive the at least one coarse tuning signal, the first fine tuning signal, or the second fine tuning signal.

17. The method of claim 14, wherein connecting the controller comprises electrically connecting at least one control line indicating a logical operation of the logical values of the at least one coarse tuning signal, the first fine tuning signal, or the second fine tuning signal to at least one switching element of the array of switching elements.

18. The method of claim 14, further comprising connecting the array of switching element to form an equalizer.

19. The method of claim 14, wherein the forming the array of switching elements comprises forming at least one of a mechanical switch, a transistor, or a thyristor as a switching element of the array of switching elements.

20. The method of claim 14, further comprising forming an array of resistors configured to receive the at least one coarse tuning signal from the controller.

* * * * *